April 18, 1967 D. F. ALLISON 3,315,138

TRANSISTOR STRUCTURE WITH SMALL INVERSE GAIN

Original Filed Jan. 2, 1964

INVENTOR.
David F. Allison

BY Fehr and Swain

Attorneys

United States Patent Office 3,315,138

Patented Apr. 18, 1967

3,315,138

TRANSISTOR STRUCTURE WITH SMALL INVERSE GAIN

David F. Allison, Palo Alto, Calif., assignor to Signetics Corporation, Sunnyvale, Calif., a corporation of California Continuation of application Ser. No. 335,335, Jan. 2, 1964. This application Sept. 1, 1966, Ser. No. 576,769
7 Claims. (Cl. 317—235)

This application is a continuation of application Ser. No. 335,335, filed Jan. 2, 1964, now abandoned.

This invention relates to a transistor structure, and more particularly to a transistor structure with a very small inverse gain.

With conventional transistors, when the collector is operated as the emitter and the emitter is operated as the collector, the reverse gain, generally speaking, is substantially reduced from the normal gain of the transistor primarily because of the difference in doping levels, difference in resistivities, and the difference in area of the emitter and collector regions. However, in certain applications, it is desirable to have the reverse gain be of a very low value which is difficult, if not impossible, to obtain with conventional transistor construction. Attempts have been made to obtain this very small reverse gain by increasing the size of the base region. This, however, has the effect of placing normally very undesirable properties in the transistor such as increasing the capacity of the transistor. There is, therefore, a need for a new and improved transistor structure which has a very small inverse gain.

In general, it is an object of the present invention to provide a transistor structure with a very small inverse gain.

Another object of the invention is to provide a transistor structure of the above character which can be readily and economically constructed.

Additional objects and features of the invention will appear from the following description in which the preferred embodiment is set forth in detail in conjunction with the accompanying drawings.

Referring to the drawings.

In general, my transistor structure with small inverse gain consists of a semiconductor body which has a surface. The body contains adjacent P and N-type regions. One of the regions is formed with an enlarged portion and an integral elongate tail-like portion. The other region is disposed in said enlarged portion of said one region to form a junction between the regions which extends to the surface and is surrounded by said enlarged portion of said one region. Contact means is secured to each of the regions. The contact means secured to said one region is secured to the tail-like portion of said one region.

Figure 1:
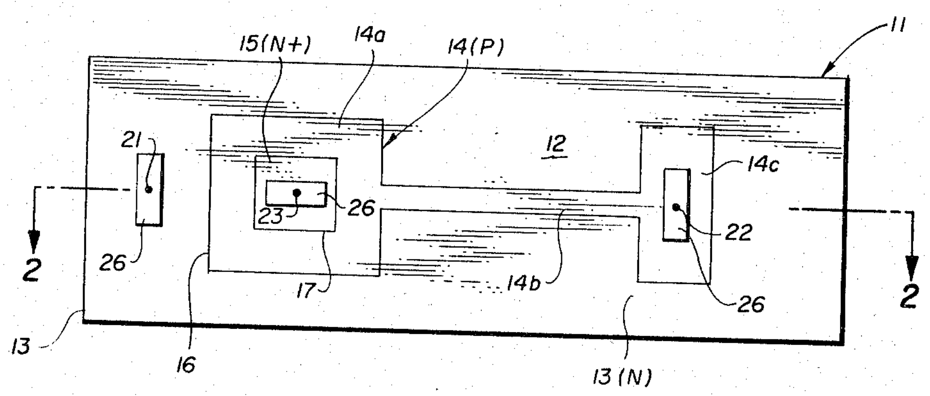
FIGURE 1 is a greatly enlarged top plan view of a transistor structure incorporating my invention.
Figure 2:
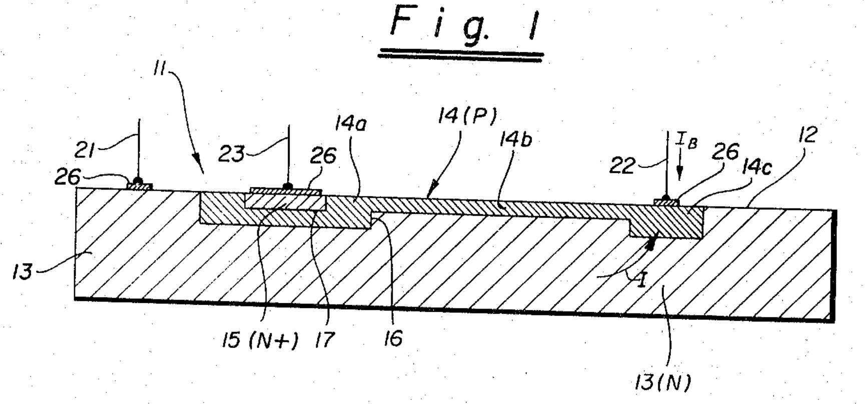
FIGURE 2 is a cross-sectional view taken along the line 2—2 of FIGURE 1.

More in particular, as shown in the drawings, my transistor structure is, in general, a semiconductor device. It consists of a body 11 of semiconductor material of a suitable type such as silicon. This body is provided with a planar surface 12 through which there is diffused N-type and P-type dopants by conventional double diffusion techniques well known to those skilled in the art which utilize appropriate masking and timing to limit the dopant to the desired areas and depths. As shown in FIGURES 1 and 2 of the drawings, the N and P-type dopants are diffused to form N and P-type regions 13, 14 and 15. These regions have been designated with the letters N, P and N+ to indicate the type of dopant utilized in the region and to indicate the type of transistor. Thus, an N-P-N type transistor is shown in the drawings. However, in a manner well known to those skilled in the art, a P-N-P transistor can be constructed in a similar manner merely by changing the dopants utilized in each step.

As shown in the drawings, the lagest region 13 is an N-type region which forms the collector of the transistor. The region 14 is a smaller P-type region and serves as the base of the transistor. The region 13 completely surrounds the region 14 so that an N-P junction 16 is formed which extends to the surface 12. As shown, the region 14 is formed with an enlarged rectangular portion 14*a*, an integral elongate tail-like portion 14*b* extending from one side of the rectangular portion 14*a*, and an enlarged rectangular junction portion 14*c*. Also, as can be seen from FIGURE 2, the portions 14*a* and 14*c* have a depth which is substantially greater than the depth of the portion 14*b*. However, this is not necessary because portions 14*a*, 14*b* and 14*c* can all be of the same thickness.

The third region 15 is doped with an N-type material and serves as the emitter of the transistor structure shown in FIGURES 1 and 2. As can be seen, the region 15 is disposed within the region 14 and is completely surrounded by the base region 14 to provide another N-P junction 17 which also extends to the surface 12.

Contact means is provided for contacting each of the regions and consists of leads 21, 22 and 23 which are bonded to the collector, base and emitter regions 13, 14 and 15, respectively. These bonds can be formed in any suitable manner well known to those skilled in the art as by thermocompression bonding. The points at which the leads are bonded to the regions are not particularly important with the exception of the base region which is provided with the tail-like portion 14*b* and the contact portion 14*c*. For reasons hereinafter explained, the lead 22 is preferably bonded to the contact portion 14*c* of the region 14 and preferably at a point which is relatively remote from the emitter region 15, as shown in the drawings. In order to provide equipotential surfaces, metal pads 26 are provided over an area of the portion 14*c*, the region 15 and the region 13.

The thickness of the base and emitter regions 14 and 15 has been greatly exaggerated and normally only will have a thickness of a few microns. The collector region, on the other hand, normally has a substantial thickness and, as shown, can extend through the entire body 11. When this is the case, contact may be made with the collector region on the other side of the body from which contact is made with the emitter and base regions if desired.

With the transistor construction shown in FIGURES 1 and 2, it can be seen that the base region 14 is provided with a relatively narrow elongate tail-like extension or portion 14*b* and a large rectangular portion 14*c*. Now, in considering the inverse beta, in which the collector becomes the emitter (ex-collector), the emitter (ex-collector) base junction is forward biased. This, in effect, injects electrons into the base area, some of which find their way to the collector (ex-emitter). A small amount of current gain will be obtained which can be called the inverse current gain. By utilization of the long narrow neck 14*b* and by the utilization of the large contact area 14*c* which serves as a diode area at the end of the neck and making the base terminal on this contact area, a voltage drop is developed down the neck. This places the portion 14*c* at the end of the neck at a larger forward bias voltage than the portion near the main body of the transistor. Since the contact portion 14*c* is forward biased most greatly, most of the current will flow directly from the emitter (ex-collector) to the neck portion 14*b* and the contact portion 14*c*. Since substantially all of the current enters the base in the region of the contact portion 14*c*, there is very little chance of any current reaching the region 15 which is being used as a collector. For that reason, substantial transistor action does not take place.

Thus, it can be seen that I have found that the arrangement shown in FIGURES 1 and 2 is very effective to obtain a very small inverse gain in the transistor because the minority carriers which are utilized to create the transistor action have a relatively short life. Since the minority carriers are first attracted to the contact portion 14*c*, very few, if any, of the minority carriers reach the region 15. For that reason, substantial transistor action is not obtained.

In summary, the overall objective of the construction shown in FIGURES 1 and 2 is to provide a transistor construction in which all or substantially all of the current passes from the N region to the P region and does not reach the N+ region.

As explained previously, with the transistor construction shown in FIGURES 1 and 2, the current entering the terminal 22, which is the base current, will cause a large voltage drop to occur as it passes along the elongate tail-like appendage to thereby force substantially all the current in the N region to be concentrated near or adjacent to the contact portion 14*c* because of the higher voltage present there so that very little current is allowed to pass into the P-type region in the vicinity of the N+ region. As a result, the transistor current gain is reduced very appreciably without actually increasing in any substantial manner the total area of the base region.

What occurs in my transistor construction can be expressed approximately by the equation:

$$I=I_0 e^{\frac{q(I_B R_B+V_j}{kT}}$$

Wherein

I is the total current through the diode portion.
$I_0$ is the saturation current of the diode portion 14*c*.
*e* is the natural logarithm exponent.
*q* is the electronic charge.
*k* is Boltzmann's constant.
T is absolute temperature.
$I_B$ is the base current which enters the contact portion 14*c*.
$R_B$ is the resistance between the contact portion 14*c* and the portion 14*a*.
$V_j$ is the junction potential at the transistor itself.

From this equation, it can be seen that we are not dealing with a resistor and a diode but we are dealing with a distributed voltage along the neck-like portion 14*b* which in itself is a diode also. The above identified equation gives an approximation of the true effect obtained. It should be realized that the neck portion 14*b* is the most important because the neck enters into the exponential term of $I_B R_B$ which is a very dominant factor.

Although as explained previously, an N-P-N type transistor has been shown in the drawings, the same teaching can be applied to P-N-P transistors.

Although a rectangular geometry has been shown in FIGURES 1 and 2, it is readily apparent that, if desired, a circular geometry can also be used and that the elongate portion 14*b* can be formed as an integral part of the circular geometry. It is apparent from the foregoing that I have provided a new and improved semiconductor device and in particular a transistor construction which has a very small inverse gain which is particularly adapted for applications requiring transistors with low inverse gains as, for example, coupling transistors in logic circuits. The construction of the transistor is such that it can be formed by presently known techniques utilizing double diffusion.

I claim:

1. In a semiconductor device having small inverse gain, a semiconductor body having a major surface, said body containing adjacent P and N-type regions, one of said regions being formed with an enlarged portion and an integral elongate tail-like portion which has a lateral dimension parallel to said surface which is substantially less than the corresponding dimension of the enlarged portion, said other region being disposed in said enlarged portion so that a junction is formed between the regions which extends to the surface and is surrounded by said enlarged portion, and contact means secured to each of said regions, said contact means secured to said one region being connected to said elongate tail-like portion at a point remote from said other region.

2. A semiconductor device as in claim 1 wherein said enlarged portion has a depth which is substantially greater than said elongate tail-like portion of said one region.

3. A semiconductor device as in claim 1 together with a contact portion secured to said tail-like portion and wherein said contact means is secured to said contact portion.

4. In a semiconductor device having small inverse gain, a semiconductor body having a major surface, said body containing adjacent P and N-type regions with a junction formed therebetween extending to the surface and at the surface forming a closed figure, on one of said regions being formed with an elongate tail-like appendage having a lateral dimension parallel to said surface substantially less than the corresponding dimension of said one region, and contact means secured to each of said regions, the contact means for the region having the tail-like portion being located in the tail-like portion at a point remote from the other region.

5. A semiconductor device as in claim 4 wherein said one region is formed with an enlarged portion and in which the elongate tail-like portion is integrally attached to the enlarged portion, said other region being disposed within said enlarged portion.

6. A semiconductor device as in claim 5 wherein said enlarged portion has a depth which is substantially greater than the depth of said tail-like portion.

7. In a semiconductor device having small inverse gain, a semiconductor body having a major surface, said body containing first, second and third regions doped with P-type and N-type materials, said second region being disposed in said first region to form a junction between the same which extends to the surface, said second region being formed with an enlarged portion and an elongate relatively narrow tail-like portion integral with the enlarged portion, said enlarged portion having a lateral dimension parallel to said surface which is substantially greater than the corresponding dimension of said elongate tail-like portion, said third region being disposed in the enlarged portion of said second region to form a junction between the second and third regions which also extends to the surface, and contact means secured to each of said regions, the contact means secured to said second region being disposed in said tail-like portion remote from said third region.

No references cited.

JOHN W. HUCKERT, *Primary Examiner.*

M. EDLOW, *Assistant Examiner.*